(12) United States Patent
Nakajima et al.

(10) Patent No.: US 6,867,484 B2
(45) Date of Patent: Mar. 15, 2005

(54) SEMICONDUCTOR DEVICE

(75) Inventors: Dai Nakajima, Tokyo (JP); Yoshihiro Kashiba, Tokyo (JP); Hideaki Chuma, Fukuoka (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 10/247,289

(22) Filed: Sep. 20, 2002

(65) Prior Publication Data

US 2003/0197255 A1 Oct. 23, 2003

(Under 37 CFR 1.47)

(30) Foreign Application Priority Data

Sep. 20, 2001 (JP) .................................. 2001-287031

(51) Int. Cl.[7] .............................................. H01L 23/02
(52) U.S. Cl. ..................... 257/678; 257/687; 257/690; 257/787
(58) Field of Search .................... 257/678, 687, 257/690, 692, 693, 701, 703, 706, 787, 788, 789

(56) References Cited

U.S. PATENT DOCUMENTS

| | | | |
|---|---|---|---|
| 5,338,974 A | * | 8/1994 | Wisherd et al. ............. 257/691 |
| 5,440,171 A | | 8/1995 | Miyano et al. |
| 5,612,570 A | | 3/1997 | Eide et al. |
| 5,665,651 A | * | 9/1997 | Asada et al. .................. 29/827 |
| 5,869,353 A | | 2/1999 | Levy et al. |
| 6,028,368 A | * | 2/2000 | Abe ............................ 257/787 |
| 6,080,932 A | * | 6/2000 | Smith et al. ............... 174/52.4 |
| 6,271,607 B1 | * | 8/2001 | Vandenbossche ......... 310/68 D |
| 6,696,753 B2 | * | 2/2004 | Tokuhara .................... 257/692 |

FOREIGN PATENT DOCUMENTS

| | | |
|---|---|---|
| DE | 36 31 963 A1 | 3/1988 |
| EP | 0 560 502 A | 9/1993 |
| JP | 56-32456 | 3/1981 |
| JP | 4-76046 | 7/1992 |
| JP | 10-289970 | 10/1998 |
| WO | WO 98/10508 | 3/1998 |

* cited by examiner

*Primary Examiner*—T. N. Quach
(74) *Attorney, Agent, or Firm*—Oblon, Spivak, McClelland, Maier & Neustadt, P.C.

(57) ABSTRACT

A semiconductor device with a package fixed to a case, comprising: a package where a semiconductor element and a lead terminal connected to the semiconductor element are sealed up; and a case formed by a frame member and an external terminal disposed to the frame member, characterized in that the package is located inside the frame of the case and the lead terminal is connected with the external terminal.

10 Claims, 4 Drawing Sheets

SEMICONDUCTOR DEVICE

CROSS-REFERENCE TO RELATED APPLICATIONS

A related patent application is a commonly assigned Japanese Patent Application No. 2001-287031 filed on Sep. 20, 2001, which is incorporated by reference into the present patent application.

BACKGROUND OF THE INVENTION

1. Field of the Invention

The present invention relates to semiconductor devices including power devices, and more particularly, to a semiconductor device including an inverter switching element.

2. Description of the Related Art

FIG. 7 is a cross sectional view of a power semiconductor device described in JP, 10-512450, A and indicated in its entirety as 500. The semiconductor device 500 includes a metal substrate 501. A circuit portion is disposed on the metal substrate 501.

The circuit portion includes an insulation substrate 502. A semiconductor element 504 is fixed on the insulation substrate 502 by means of a solder layer 503. Leads 505 are connected to an electrode of the semiconductor element 504 by bonding wires 506. The semiconductor element 504 and the like are sealed up in mold resin 507. The circuit portion is fixed on the metal substrate (base plate) 501 by means of a solder layer 508.

Further, a control circuit board 510 is disposed on the metal substrate 501, while a conductor 511, a relay terminal 512 and the like are disposed on the control circuit board 510.

In addition, a relay substrate 520 is disposed on the metal substrate 501, and a conductor 521 is disposed on the relay substrate 520.

The leads 505 of the circuit portion are connected with a main circuit terminal 530 and a control terminal 531 through the conductor 511.

Such a semiconductor device 500 is used with a heat sink (not shown) attached to a back face of the metal substrate 501. Typically grease (not shown) is thinly applied between the metal substrate 501 and the heat sink. As screws are turned into screw holes formed in the metal substrate 501, the heat sink and the metal substrate 501 get fixed (not shown).

However, since the circuit portion and the like are disposed on the expensive metal substrate 501, it is difficult to cut costs of manufacturing the semiconductor device 500. When a large current is to be carried by a circuitry wire disposed on the metal substrate 501, since the circuitry wire needs to be large not only in the thickness direction but also in the width direction, the size of the metal substrate 501 can not be reduced.

Meanwhile, efficiency of heat dissipation from the semiconductor device 500 is largely dependent upon the level of adhesion between the metal substrate 501 and the heat sink. The metal substrate 501 is designed in advance in such a manner that the metal substrate 501 has a flat back ace as a finished product mounting the circuit portion 550 and the like. The back face of the metal substrate 501 is not to be processed flat after completion of the final product.

Hence, the surface area of the metal substrate 501 is large at the time of assembling more than one circuit portion into the semiconductor device 500, and therefore, it is difficult to ensure the flatness of the back face.

On the other hand, when the semiconductor element 504 is fixed directly on the metal substrate 501, the mold resin 507 warps. That in turn leads to a variation in film thickness of the solder layer connecting the semiconductor element 504 and the mold resin 507 to each other, causing a drop in reliability and a variation in thermal resistance.

In addition, there is a problem that the tight adhesion between the metal substrate 501 and the mold resin 507 becomes insufficient and dielectric breakdown accordingly occurs.

Further, when the locations of the main circuit terminal 530 and the like are to be changed, it is necessary to change the whole design of the semiconductor device 500 including the circuit portion.

SUMMARY OF THE INVENTION

The object of the present invention is to provide a semiconductor device adhered well to a heat sink, reducible in size and allowing an easy modification of the design of an external terminal.

The present invention is directed to a semiconductor device having a package fixed to a case. The semiconductor device includes a package where a semiconductor element and a lead terminal connected to the semiconductor element are sealed up; and a case formed by a frame member with an external terminal. The package is located inside the frame of the case and the lead terminal is connected with the external terminal. The package may include mold resin for burying the semiconductor element and an insulation substrate mounting the semiconductor element and exposing its back face from the mold resin, while the back face of the case and a back face of the package may be approximately flush to each other. Also, the external terminal may have a spring action and a back face of the package may be located below a back face of the case.

DETAILED DESCRIPTION OF THE PREFERRED EMBODIMENTS

First Preferred Embodiment

Figure 1:
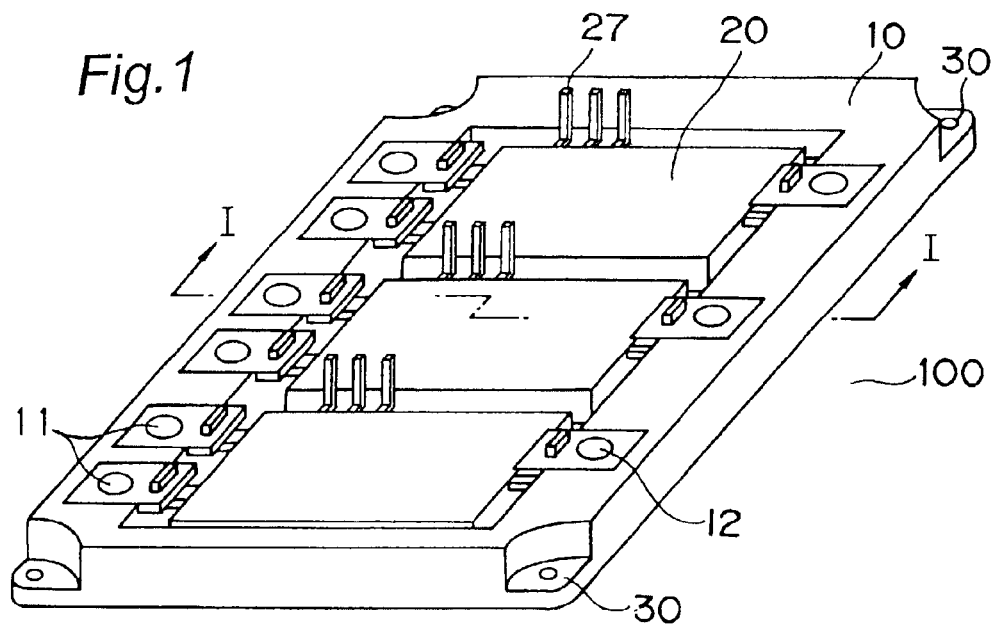
FIG. 1 is a schematic diagram of the semiconductor device according to the first preferred embodiment.
Figure 2:
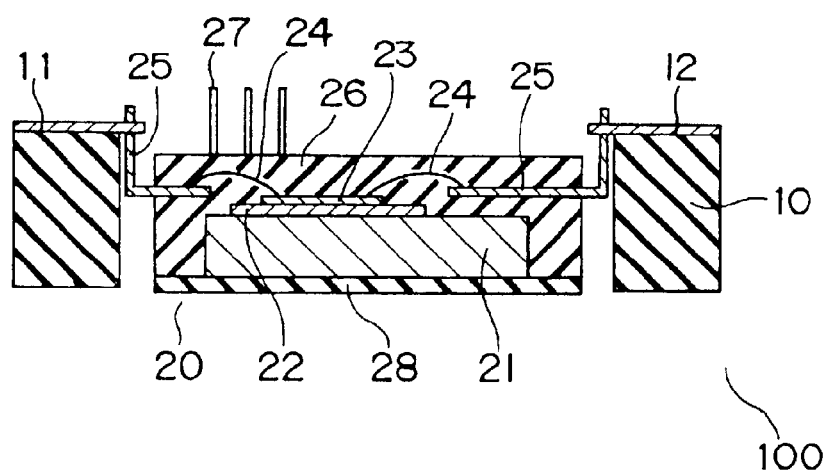
FIG. 2 is a cross sectional view of the semiconductor device according to the first preferred embodiment.

FIG. 1 is a schematic diagram of a semiconductor device according to a first preferred embodiment, indicated in its entirety as 100. FIG. 2 is a cross sectional view taken along the I—I direction in FIG. 1.

The semiconductor device 100 includes a case 10 and three packages 20. The case 10 is formed by frame members of resin material shaped like a picture frame, and external terminals 11 and 12 are disposed to the case 10. The external terminals 11 and 12 may be sealed up in the resin of the frame members (insert case) or alternatively attached after the frame members are formed (outer leads) The external terminals 11 are input terminals while the external terminals 12 are output terminals. On the four corners of the case, there are screw holes 30 for connection with a heat sink (not shown).

As shown in FIG. 2, the packages 20 include metal blocks 21 of copper for instance. Semiconductor elements 23 are fixed on the metal blocks 21 through frames 22. As the semiconductor elements 23, power FETs, IGBTs (insulated gate bipolar transistor) or the like are used.

Electrodes of the semiconductor elements 23 are connected with leads 25 by bonding wires 24 of aluminum or the like of about 300 μm in diameter. In this example, the semiconductor elements 23 consist of two power FETs connected in series, the both edge portions of the semiconductor elements 23 are connected with the external terminals 11 of the input side, and connecting portions between the power FETs are connected with the external terminals 12 of the output side.

The metal blocks 21 and the like are sealed up by mold resin 26 such as epoxy resin. Sealed up at the same time in the mold resin 26 are control terminals 27 as well. An insulation substrate 28 of ceramics or the like is fixed to back faces of the metal blocks 21. The film thickness of the insulation substrate 28 is 0.635 mm for example.

With the leads 25 and the external terminals 11, 12 connected with each other, the packages 20 are fixed within the case 10.

A method of manufacturing the semiconductor device 100 will now be briefly described.

First, the packages 20 are assembled using a transfer mold apparatus after mounting the semiconductor elements 23 and the like on the metal blocks 21. In short, after placing a lead frame, where the metal blocks 21 and the like are fixed, within a metal mold, epoxy resin or the like is let flow into the metal mold to form the mold resin 26. At this stage, the back faces of the metal blocks 21 are left exposed from the metal mold. After forming the mold resin 26, the metal blocks 21 are detached from the metal mold, and the insulation substrate 28 is bonded to the back faces of the metal blocks 21 using silver paste or the like. At last, an unnecessary portion of the lead frame is removed and the lead frame is processed into a desired shape, so that the leads 25 are obtained. This completes assembling of the packages 20.

Next, the packages 20 are put into the case 10, and the external terminals 11, 12 and the leads 25 are connected with each other. For this connection, a solder or the like is used for instance. For attachment of the packages 20 to the case 10, a back face of the case 10 is ensured to be approximately flush with back faces of the packages 20 (insulation substrate 28). In other words, the insulation substrate 28 is ensured to be in contact with the heat sink as the heat sink (not shown) is attached to the case 10.

In general, mold resin has a different coefficient of linear thermal expansion from that of a metal block which acts a heat spreader. This may lead to a difference in temperature as a semiconductor element develops heat, and further, to warping of the package. If the warping is beyond a few hundreds μm for instance, a gap is created between the package and a heat sink where the package is fixed, and a heat dissipation effect accordingly deteriorates. Thus created warping in particular has a tendency to grow larger, as the packages become thicker.

Meanwhile, in the semiconductor device 100 according to the first preferred embodiment, the semiconductor elements 23 are sealed up in the plurality of packages 20 and then connected by means of the case 10. For this reason, each package 20 is small in size and therefore barely warps. This makes it possible to dissipate heat in a stable manner from the semiconductor device 100 to the heat sink.

For reduction of warping of the packages 20 described above, it is desirable that the coefficient of linear thermal expansion of the metal blocks 21 which act as heat spreaders and that of the mold resin 26 are as close as possible to each other. For example, when the metal blocks 21 are of copper, the coefficient of linear thermal expansion of the mold resin 26 is preferably about $16 \times 10^{-6}/°$ C.

In addition, according to the first preferred embodiment, the insulation substrate 28 is attached to the back faces of the metal blocks 21 after the resin mold step. This is because the packages 20 will warp larger if the insulation substrate 28 is attached before the resin mold step. Although it is desirable to dispose the insulation substrate 28 before the resin mold step and bring the mold resin 26 and the insulation substrate 28 into tight adhesion to each other for the purpose of increasing the tolerance for dielectric breakdown, it is desirable to attach the insulation substrate 28 after the resin mold step for the purpose of decreasing the scale of warping.

Further, when the semiconductor device 100 is to be used as a converter, two semiconductor elements 23 including two IGBTs connected in series are necessary. When the semiconductor device 100 is to be used as an output for a three-phase motor, three such semiconductor elements are necessary. With respect to the semiconductor device 100 according to the first preferred embodiment, when the structure of the case 10 alone is changed and the number of the packages 20 to be incorporated is adjusted, it is possible to fabricate the semiconductor device 100 incorporating two, three or more semiconductor elements 23, without changing the design of the packages 20. The semiconductor elements 23 incorporated in the packages 20 may be freely changed in accordance with an application of the semiconductor device 100.

Figure 3:
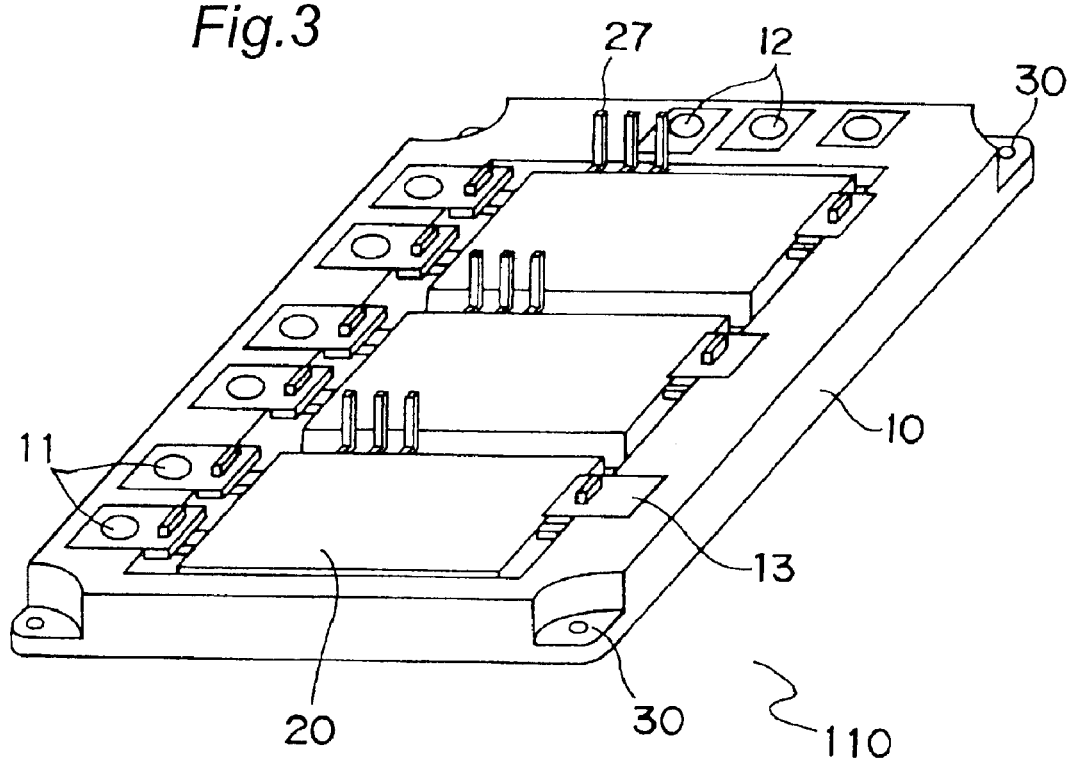
FIG. 3 is a schematic diagram of the semiconductor device according to the first preferred embodiment.

FIG. 3 is a schematic diagram of other semiconductor device according to the first preferred embodiment, indicated in its entirety as 110. In FIG. 3, the same reference numerals as those used in FIG. 1 denote the same or corresponding portions. The semiconductor device 110 shown in FIG. 3 is different from the semiconductor device 100 shown in FIG. 1 regarding the disposing locations of the external terminals 12.

Figure 7:
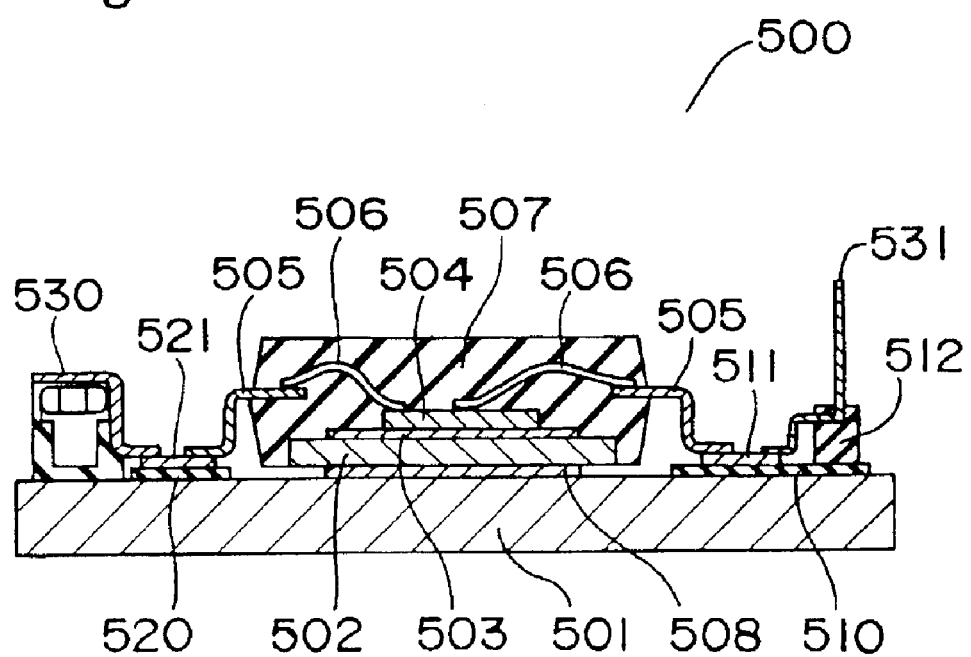
FIG. 7 is a cross sectional view of the conventional semiconductor device.

Thus, the locations of the external terminals 11 and 12 need to be changed depending on the layout of external wires connected with the semiconductor devices 100, 110. In the case of the conventional semiconductor device 500 shown in FIG. 7, it is necessary to modify the designs of the circuit portion, the control circuit board 510, the relay substrate 520 and the like.

In contrast, in the case of the semiconductor device 120 according to this preferred embodiment, as shown in FIG. 3, it is possible to deal with the changed locations of the external terminals 12 merely by modifying the design of the case 10 without changing the design of the packages 20.

Wires (not shown) buried in the case 10 connect relay terminals 13 and the external terminals 12.

Further, by disposing the external terminals 11, 12 and further the relay terminals 13 and placing the packages 20 side by side as in the semiconductor devices 100 and 110, a bridge circuit is formed. Owing particularly to a short inter-terminal distance between the external terminals 12 on the input side, it is possible to decrease the entire inductance of the semiconductor devices 100, 120 and reduce a loss associated with switching of the semiconductor elements.

The material of the insulation substrate 28 is preferably a ceramic material such as aluminum nitride for example. The reason is that the thermal conductivity of aluminum nitride is 100 times as much as that of the generally used mold resin 26, and is accordingly excellent in heat dissipation. Any material having at least higher thermal conductivity than that of the mold resin 26 may be used instead of aluminum nitride.

Although silver paste is used for adhesion of the insulation substrate 28 to the metal blocks 21, other material such as grease may be used so as to fill up asperities of an adhesion surface of the metal blocks 21 and the insulation substrate 28.

Further, in the event that the insulation substrate 28 is of ceramic material, it is necessary to apply grease between the insulation substrate 28 and the heat sink (not shown). On the other hand, if the insulation substrate 28 is of other flexible and adhesive material, the insulation substrate 28 and the heat sink can be connected with each other without using grease.

Second Preferred Embodiment

Figure 4:
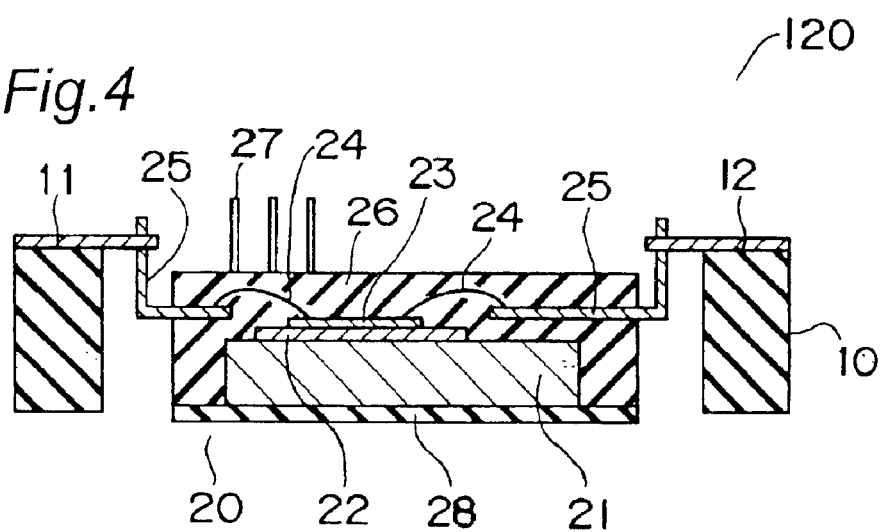
FIG. 4 is a cross sectional view of the semiconductor device according to the second preferred embodiment.

FIG. 4 is a cross sectional view of a semiconductor according to a second preferred embodiment, indicated in its entirety as 120. FIG. 4 is a cross sectional view taken along the I—I direction in FIG. 1. In FIG. 4, the same reference numerals as those used in FIG. 2 denote the same or corresponding portions.

In the semiconductor device 120, the external terminals 11 and 12 are of a material with spring action. Materials with a spring action are not necessarily limited to so-called spring materials but include oxygen free copper, tough pitch copper, titaniferous copper material, a cladding material made of conductive material and spring material, etc.

Further, the case 10 and the packages 20 are fixed in such a manner that the back faces of the packages 20 slightly project beyond the back face of the case 10.

The semiconductor device 120 is connected with a heat sink (not shown) by means of the screw holes 30 formed in the case 10. When the semiconductor device 120 is placed in the heat sink and screwed, the elastic external terminals 11, 12 warp. As a result, the semiconductor device 120 is fixed to the heat sink with the back face of the case 10 approximately flush with the back faces of the packages 20.

In a condition that the semiconductor device 120 is fixed to the heat sink, the packages 20 are pressed against the heat sink due to the spring action of the external terminals 11, 12. This improves the condition of contact between the packages 20 and the heat sink, and hence, heat dissipation efficiency. When grease is applied between the packages 20 and the heat sink in particular, as the packages 20 are pressed against the heat sink, excessive grease is pushed out from between the packages 20 and the heat sink, and the connection interface accordingly has low thermal resistance.

In addition, even if screws to hold the case 10 together with the heat sink get loose during the use of the semiconductor device 120, since the external terminals 11, 12 have the spring action, the connection between the packages 20 and the heat sink stays, preventing in turn a deterioration in heat dissipation efficiency.

In the event that the plurality of packages 20 are attached to the case 10 to form the semiconductor device 120 as shown in FIGS. 1 and 3, the individual packages 20 get pressed against the heat sink independently of each other. Hence, even if the connection surface of the heat sink warps a little, each package 20 is pressed against the connection surface of the heat sink and excellent heat dissipation is achieved.

In the event that only one package 20 is attached to the case 10 as well, excellent heat dissipation is achieved in a similar manner.

Although the foregoing has described the second preferred embodiment in relation to an example that the external terminals 11, 12 are of elastic material, the case 10 and the packages 20 may be connected with each other by an element such as a plate spring having spring action separately from the external terminals 11, 12. In this case, a flexible material needs to be used as the external terminals 11 and 12 although it is not necessary to have spring action. Where the relay terminals 13 are to be used as shown in FIG. 3, the relay terminals 13 need to have spring action.

As described above, in the semiconductor device 120 according to the second preferred embodiment, since the packages 20 are fixed as they are pressed against the heat sink, a satisfactory heat dissipation characteristic is obtained.

Third Preferred Embodiment

Figure 5:
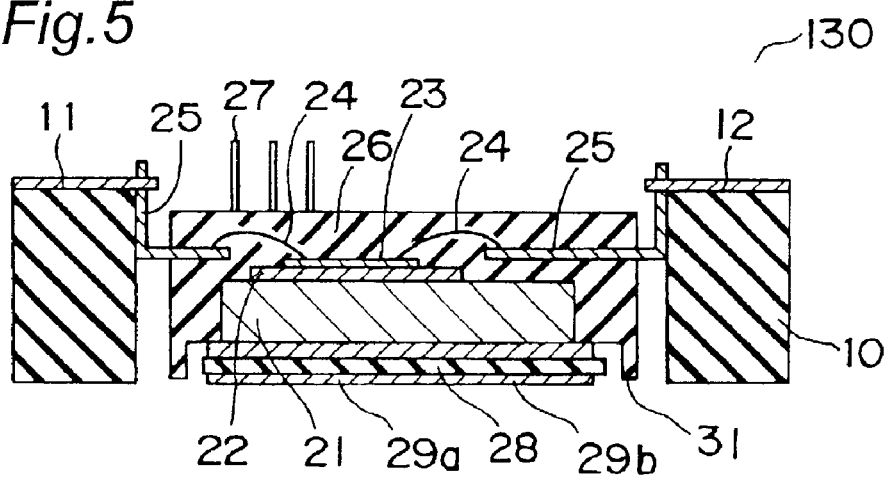
FIG. 5 is a cross sectional view of the semiconductor device according to the third preferred embodiment.

FIG. 5 is a cross sectional view of a semiconductor device according to a third preferred embodiment, indicated in its entirety as 130. FIG. 5 is a cross sectional view taken along the I—I direction in FIG. 1. In FIG. 5, the same reference numerals as those used in FIG. 2 denote the same or corresponding portions.

The semiconductor device 130 according to the third preferred embodiment is for preventing the insulation substrate 28 from splitting during attachment of the semiconductor device 130 to a heat sink.

With respect to the semiconductor device 130, first, the insulation substrate 28 fixed to the back faces of the metal blocks 21 includes, on its both surfaces, metal layers 29a, 29b of copper for instance. In short, in the case that the insulation substrate 28 is made of flexible material, the insulation substrate 28 will not crack while fixed to the heat sink. However, it is preferable to use ceramic material having high thermal conductivity as the insulation substrate 28 for a semiconductor device when the calorific value of the semiconductor is over 100W. Meanwhile, use of ceramic material as the insulation substrate 28 may in some situations break or chip the ceramics during attachment to the heat sink. This is more prominent as the surface area of the insulation substrate 28 is larger and the connection surface of the heat sink is coarser.

In contrast, in the semiconductor device 130, the insulation substrate 28 having the metal layers 29a, 29b seated on the both surfaces is fixed to the back faces of the metal blocks 21 in advance. This makes it possible to prevent the insulation substrate 28 from cracking during fixing the semiconductor device 130 to the heat sink.

Further, the semiconductor device 130 according to the third preferred embodiment includes a projection 31 protruding towards below in skirt-like shape from the resin mold 26 provided as a portion of the resin mold 26. The projection 31 is disposed to surround the insulation substrate 28 to end half way through the metal layer 29b. As the metal mold for resin molding is shaped to have a projection, the projection 31 is created at the same time of molding the resin mold 26.

When the connection surfaces of the semiconductor device 130 and the heat sink do not become parallel to each other during attachment of the semiconductor device 130 to the heat sink, and even if a portion of the bottom face of the semiconductor device 130 is pressed against the heat sink, the insulation substrate 28 of ceramics will not get cracked or chipped. This is because that the resin mold 26 has the projection 31 in this manner. In addition, since the projection 31 embraces the insulation substrate 28, it is possible to prevent the insulation substrate 28 from getting cracked or otherwise damaged while transported or handled.

Since the metal layer 29b in particular is located below the projection 31, as the semiconductor device 130 is fixed to the heat sink, the metal layer 29b gets pressed against and fixed to the heat sink, thereby improving the heat dissipation efficiency.

Figure 6:
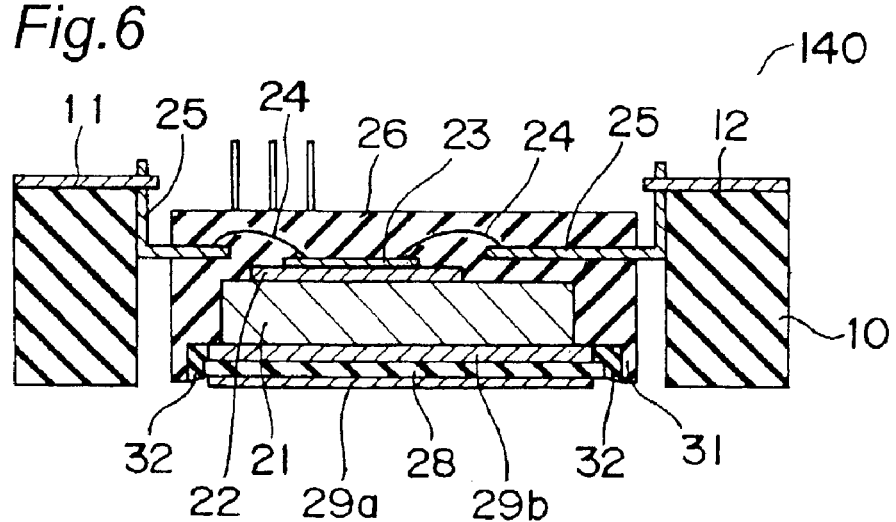
FIG. 6 is a cross sectional view of the semiconductor device according to the third preferred embodiment.

FIG. 6 shows other semiconductor device according to the third preferred embodiment, indicated in its entirety by 140. In the semiconductor device 140, except that there is an insulator 32 of silicone resins or the like disposed inside the projection 31, the structure is the same as that of the semiconductor device 130.

When the semiconductor device is used at a higher voltage, dielectric breakdown occurs more easily between the metal layers 29a, 29b disposed on the both sides of the insulation substrate 28. Although dielectric breakdown can be prevented by making the surface area of the insulation substrate 28 larger than that of the metal blocks 21, expansion of the insulation substrate 28 leads to cost increase, cracking of the insulation substrate, etc.

Noting this, according to the third preferred embodiment, the insulator 32 is buried inside the projection 31, and the tolerance for dielectric breakdown is enhanced without expanding the insulation substrate 28.

Between the projection 31 of the resin mold 26 and the insulation substrate 28, a cavity is preferably created providing enough capacity to bury the insulator 32. The insulator 32 is obtained by injecting silicone resins inside the projection 31 for instance, using a dispenser and thereafter curing.

The semiconductor devices 130 and 140 use the insulation substrate 28 having the metal layers 29a, 29b seated on its both surfaces. This is because the layers of the same material disposed on the sides of the insulation substrate 28 prevent the insulation substrate 28 from warping. Hence, only the metal layer 29b may be disposed in case that no warping of the insulation substrate 28 is expected.

The structure according to the third preferred embodiment is applicable to any one of the semiconductor devices 100, 110 and 120.

As described above, in the semiconductor device according to the third preferred embodiment, even when the insulation substrate is made of ceramic material, cracking or the like of the insulation substrate can be prevented. In addition, dielectric breakdown can be prevented above and below the insulation substrate.

As is clear from the foregoing, with respect to the semiconductor device according to the above embodiments, it is possible to change the whole design of the semiconductor device merely by changing the design of the case.

Further, the semiconductor device achieves an excellent heat dissipation characteristic since the semiconductor device well adheres to the heat sink.

Moreover, in the semiconductor device, the tolerance for dielectric breakdown is large between the metal blocks and the heat sink.

What is claimed is:

1. A semiconductor device comprising:

a package having side walls where a semiconductor element and a lead terminal connected to said semiconductor element are sealed; and a case formed by a frame member and an external terminal disposed to said frame member, characterized in that said package is located inside the frame of said case and said lead terminal is connected with said external terminal, and an air cavity separates said side walls of the package from the frame member.

2. A semiconductor device according to claim 1, characterized in that said package comprises mold resin having said semiconductor element buried in it and an insulation substrate mounting said semiconductor element with a back face exposed from said mold resin, while a back face of said case and a back face of said package are approximately flush to each other.

3. A semiconductor device according to claim 2, characterized in that said package comprises a metal layer disposed to the back face of said insulation substrate.

4. A semiconductor device according to claims 3, characterized in that said mold resin comprises a skirt-like shaped projection extending to below from a bottom face of said mold resin and embraces said insulation substrate.

5. A semiconductor device according to claim 4, characterized in that a cavity surrounded by said projection is filled with insulating material.

6. A semiconductor device according to claim 1, characterized in that said external terminal has a spring action and a back face of said package is located below a back face of said case.

7. A semiconductor device according to claims 1, characterized in that said package comprises-said lead terminals for input located adjacent to each other.

8. A semiconductor device according to claim 1, characterized in that said case is formed by frame members shaped like a picture frame, while an input external terminal and an output external terminal are disposed to said frame members facing each other having said package in between.

9. A semiconductor device according to claim 1, characterized in that said case is formed by frame members shaped like a picture frame, while an input external terminal and an output external terminal are disposed to two of said frame members adjacent to each other.

10. A semiconductor device according to claims 1, characterized in that a plurality of said packages placed side by side within said case.

* * * * *